Sept. 2, 1952 R. M. WILMOTTE 2,609,510

ELECTRONIC HEATING CONTROL SYSTEM

Filed Aug. 6, 1945 2 SHEETS—SHEET 1

Fig. I

Inventor

Raymond M. Wilmotte

By

Attorney

Sept. 2, 1952 R. M. WILMOTTE 2,609,510

ELECTRONIC HEATING CONTROL SYSTEM

Filed Aug. 6, 1945 2 SHEETS—SHEET 2

Inventor

Raymond M. Wilmotte

By

Attorney

Patented Sept. 2, 1952 2,609,510

UNITED STATES PATENT OFFICE 2,609,510

ELECTRONIC HEATING CONTROL SYSTEM

Raymond M. Wilmotte, Washington, D. C., assignor to Padevco, Inc., Washington, D. C., a corporation of Delaware Application August 6, 1945, Serial No. 609,245

16 Claims. (Cl. 250—36)

This invention relates to high frequency generators, particularly for electronic heating.

In electronic heating applications the loading is usually very heavy and highly variable. These conditions make it difficult to maintain the load and the high frequency generator tuned to the same constant frequency and to produce uniform heating of a desirable magnitude throughout the heating cycle. In dielectric heating, for example, both the power factor and the dielectric constant of the load vary from moment to moment thus detuning the load and varying the amount of power drawn by it. These variations produce a number of very serious difficulties. When the generator consists simply of a high power oscillator, the load variations may cause the oscillator to jump frequency and drop the load when the loading reaches a high value. Also, a sufficient change in the dielectric constant of the load may cause a dropping of the load due to a difference in resonant frequency between the load circuit and the resonant output circuit. This is particularly true where the high frequency generator utilizes a power amplifier. When the coupling between the load and the oscillator is so tight that the load reflects a high reactance into the oscillator tank circuit, wide variations in the generated frequency may be produced throughout a heating cycle causing a maximum of radio interference. Furthermore, variations in the load make it difficult to operate the generator efficiently throughout the heating cycle.

It is an object of my invention to control the coupling and tuning of the load and the tank circuits so as to overcome these difficulties.

The invention will be fully understood from the following specification and the drawing in which.

Figure 1:
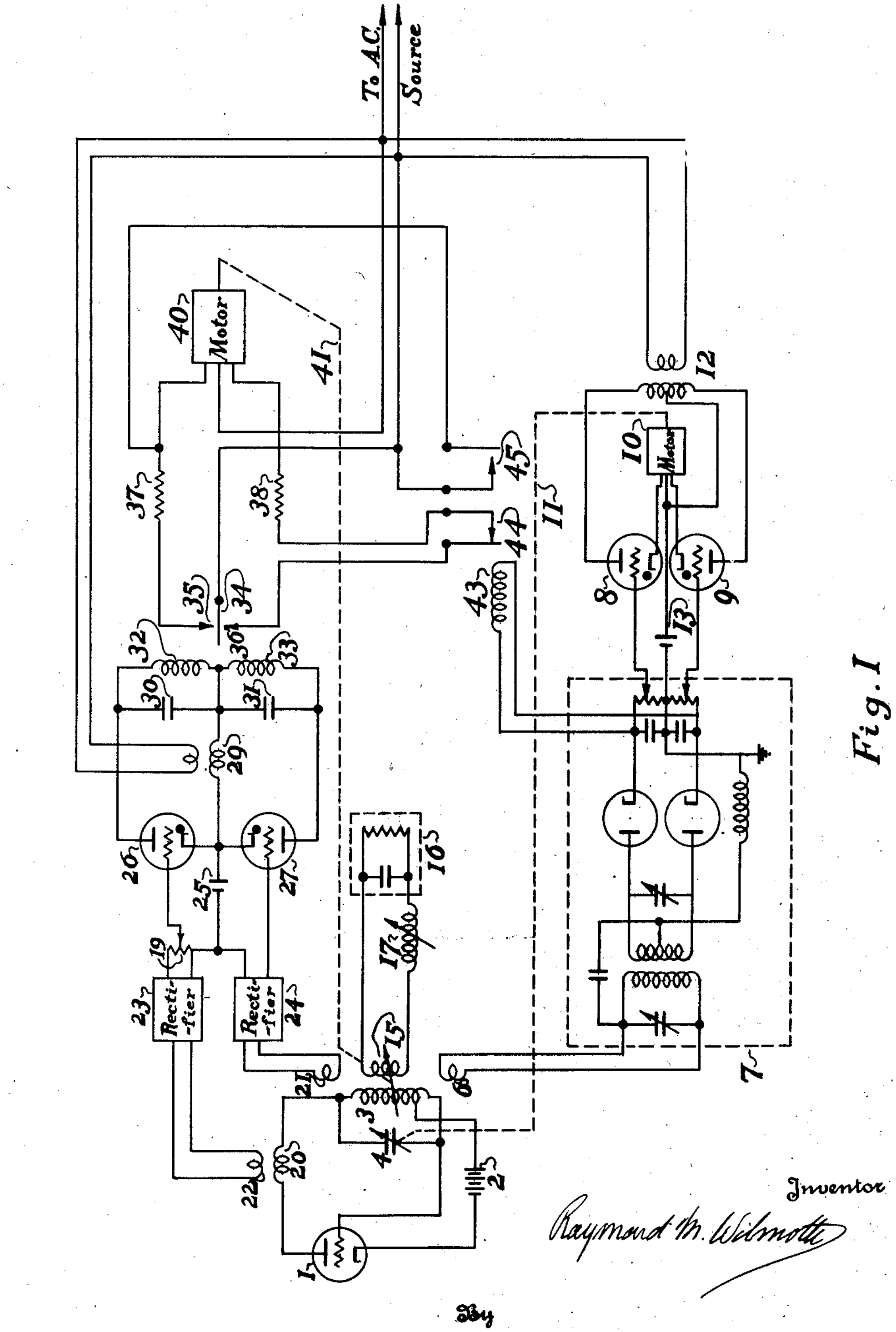
Figure 1 shows an embodiment of my invention applied to a power oscillator.

Referring to Figure 1, the oscillator is shown as consisting of an electron tube 1, a source of plate voltage 2, and an anti-resonant tank circuit consisting of an inductance 3 and condenser 4. The oscillator is shown as being of the Hartley type but this is merely illustrative and any suitable oscillator may be used. For the sake of simplicity such conventional elements as by-pass condensers, choke coils and additional voltage sources are omitted. The oscillator is shown coupled to the load circuit 16 by means of a coupling coil 15. At 17 is shown a variable inductance for tuning the load circuit. It will be understood that the load circuit is merely represented schematically and may have either a capacitive or an inductive reactance and the tuning element 17 will have a reactance of the proper sign and magnitude to tune whatever load is applied. Also, the tuner may be a reactance in parallel with the load as well as a reactance in series with the load, the type of tuning being immaterial to my invention.

By means of a coupling coil 6 a voltage proportional to the current of the tank circuit 3, 4 is derived and impressed on a discriminator 7. This discriminator is of the conventional type utilized in FM receivers and in automatic frequency control circuits of AM receivers and therefore need not be described in detail. The output of the discriminator is impressed on the control grids of a pair of gaseous tubes 8 and 9 in the plate circuits of which is connected a reversible A. C. motor 10. The motor has a mechanical coupling 11 to condenser 4. A source of A. C. voltage is connected through transformer 12 to the plate circuits of tubes 8 and 9. A bias voltage may be provided by a battery 13 to maintain tubes 8 and 9 normally non-conductive.

Figure 2:
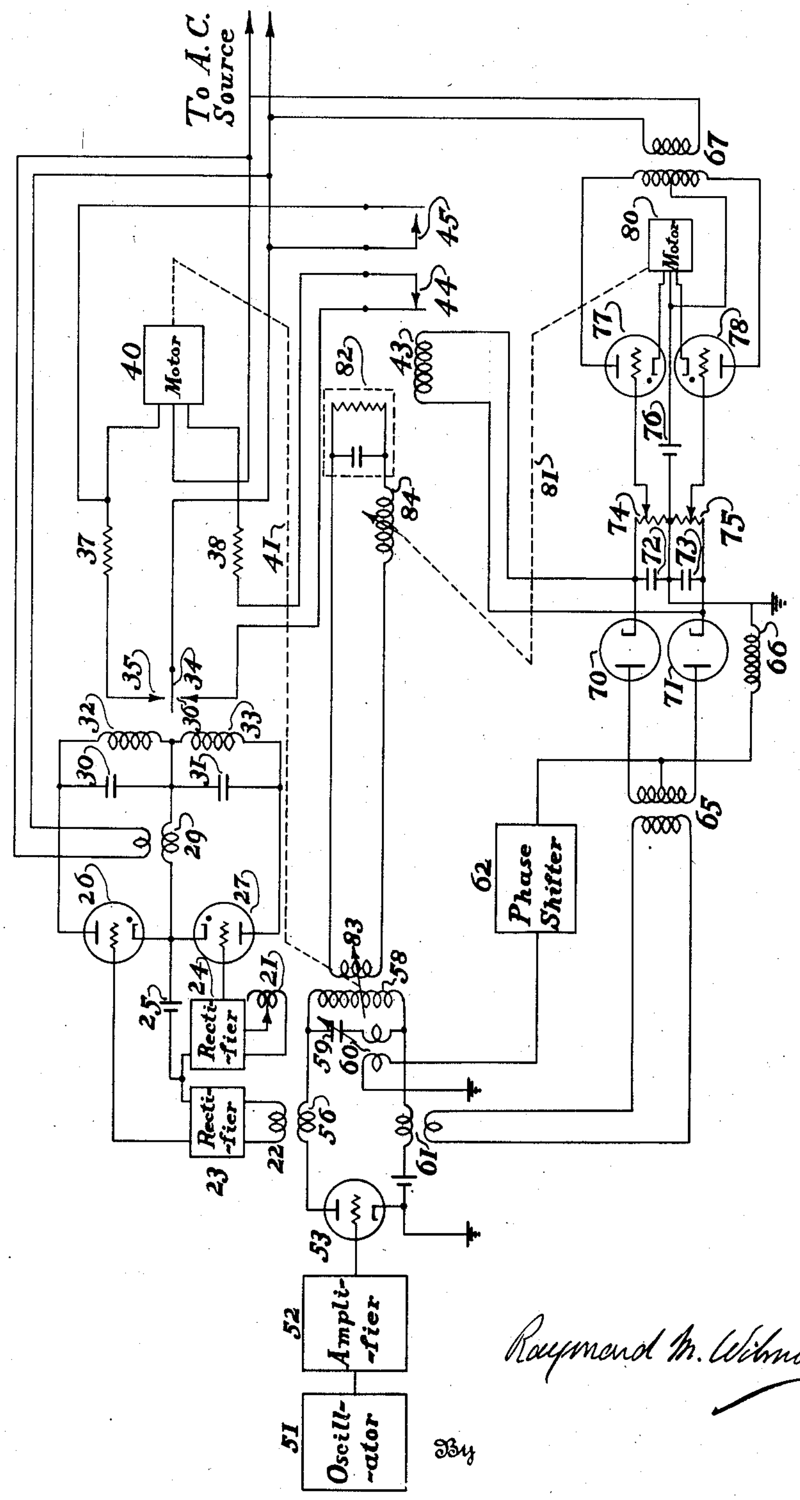
Figure 2 shows my invention applied to a high frequency generator utilizing a power amplifier.

The operation of the circuit so far described is as follows: the oscillator will be tuned to or maintained at its prescribed operating frequency with the load decoupled. As the coupling to the load is increased any reactive component of the load circuit impedance will be reflected into the tank circuit of the oscillator and cause it to be detuned. Other factors may also cause detuning of the oscillator. The detuning of the oscillator will cause the discriminator 7 to produce a positive voltage at the grid of either tube 8 or 9. When this positive voltage reaches a given value, determined by the bias battery 13 and the peak plate voltage impressed by the transformer 12, one of these tubes will become conductive and the motor will begin to rotate. The coupling 11 between the motor 10 and condenser 4 is arranged so that the condenser will be turned to retune the oscillator to its proper frequency, determined by the discriminator. The oscillator tank circuit could also be tuned by connecting motor 10 to tuner 17 in the same manner as is shown in Figure 2 to vary the reactance reflected into the oscillator tank circuit 3, 4 by the load circuit 15, 16, 17.

I will now describe the portion of the circuit which controls the coupling between the tank circuit and the load circuit so as to maintain the oscillator properly loaded throughout the heating cycle.

Referring again to Figure 1, coils 21 and 22 are coupled to coils 3 and 20 respectively. The voltages developed across coils 21 and 22 are impressed on a pair of rectifiers 23 and 24. A potentiometer 19 is connected across rectifier 23. By adjusting this potentiometer the operator can, preferably by an externally accessible knob, control the Q value of the oscillator tank circuit and consequently the amount of load current. The outputs of these rectifiers are connected between the cathodes and grids of gaseous tubes 26 and 27. A source of bias voltage 25 is provided to maintain tubes 26 and 27 normally non-conducting. The rectifiers 23 and 24 may be provided with sufficient by-pass and filtering elements to prevent any radio frequency potential from being impressed on the grids of tubes 26 and 27. In the anode circuits of these tubes is provided a source of A. C. voltage 29 as shown, or a direct current source. Between the cathodes and the anodes of these tubes are connected by-pass condensers 30 and 31 and relay coils 32 and 33. The relay includes, besides coils 32 and 33, a movable contact 34 and fixed contacts 35 and 36. Contacts 34, 35 and 36 are connected to a source of alternating current voltage and to a motor 40 through a pair of resistors 37 and 38. The motor is a reversible A. C. motor of any suitable type and may have a mechanical connection 41 for controlling the coupling between the coils 3 and 15.

Another relay having a coil 43 and two sets of contacts 44 and 45 is provided for a purpose now to be described. The coil 43 is connected across the output of the discriminator so as to be operated thereby whenever the discriminator output attains a predetermined magnitude. The contacts 44 are normally closed and the contacts 45 are normally open. When the coil 43 is energized, contacts 44 open and contacts 45 close. Relay 32, 33 and resistors 37 and 38 make the operation of the coupling control circuit slower than that of the tuning control circuit.

The operation of the coupling control circuit is as follows: The coils 21 and 22 and the rectifiers 23 and 24 and bias battery 25 are so adjusted that the output of the rectifiers 23 and 24 will be equal and not sufficient to trigger tubes 26 and 27 when the tank circuit 3, 4 is loaded so as to have a predetermined Q value. A change in the Q value of the tank circuit, which may be caused by a variation in the load 16, will cause the output of one of the rectifiers, 23 or 24, to increase and the other to decrease. This will cause one of the tubes, 26 or 27, to become conductive. The movable contact 34 will then be attracted to either fixed contact 35 or 36, depending on which tube is energized. The closing of the movable contact against one of the fixed contacts will cause the motor 40 to rotate and the direction of rotation will be determined by the direction of movement of the contact 34, provided contacts 44 and 45 are in their normal positions. The motor 40 is connected to the coupling control in such a manner as to reload the tank circuit to re-establish the predetermined Q value.

If the oscillator drifts off frequency beyond certain limits it is desirable to partially decouple the load circuit therefrom and retune the oscillator to its proper frequency. The simultaneous operation of the returning circuit and the coupling control circuit might produce complications which would prevent their proper operation. Also, to reduce interfering radiation from the load circuit it is desirable to decouple the load circuit when the oscillator frequency has changed. It is therefore desirable to operate the tuning control circuit and the coupling control circuits successively when the oscillator has drifted off frequency considerably. This is done by energizing relay coil 43 which separates contacts 44 and thereby prevents the motor 40 from tightening the coupling and simultaneously closes contacts 45 to cause the motor 40 to loosen the coupling. While this is occurring the motor 10 retunes the load circuit thereby reducing the output of the discriminator and de-energizing coil 43 and restoring contacts 44 and 45 to their normal positions. The coupling control circuit is then conditioned for operation and can function to adjust the coupling to its proper value. If desired, contacts 45 may be omitted and in this case motor 40 will be prevented from increasing the coupling during operation of the retuning circuits.

Reference is now made to Figure 2 showing a high frequency generator consisting of a radio frequency oscillator 51, amplifiers 52 and a power amplifier 53. The power amplifier is provided with an output circuit consisting of an inductance 58 and a condenser 59. A load 82 is coupled to the output circuit by means of a coil 83. In order to maintain a high rate of heating of the load 82 and to utilize the generator efficiently it is necessary to tune the load circuit to resonance and for this purpose a tuner 84 is provided. The tuner 84 is shown as being a variable inductance but it will be recognized that it may be a capacitive reactance, depending on the nature of the load and other elements of the load circuit. In order to adjust the tuner 84 so as to maintain the load circuit resonant at the working frequency the following circuit is provided. Transformers 60 and 61 impress voltages in quadrature on the anodes of tubes 70 and 71. These voltages will be normally substantially in quadrature but, if necessary, a phase shifter 62 may be provided to obtain the quadrature relationship. The circuits of tube 70 and 71 are similar to a conventional discriminator such as shown at 7 in Figure 1. The circuits of these tubes consist of a choke coil 66, by-pass condensers 72 and 73, and potentiometers 74 and 75. The output of this discriminator circuit is impressed on the control grids of a pair of gaseous tubes 77 and 78. The anode circuits of these tubes are energized by the transformer 67 connected to an alternating current source. A reversible A. C. motor 80 is connected to the anodes of tubes 77 and 78 as shown. The motor 80 has a mechanical coupling 81 to the tuner 84.

The adjustment of the tuner 84 is produced as follows: When the load circuit becomes detuned for any reason, such as a variation in the dielectric constant of the load, a reactance is reflected into the tank circuit 58, 59 and produces a sharp change in the quadrature relationship of the voltages impressed on the anodes of tubes 70 and 71. This causes the output of one of these tubes to increase and the output of the other tube to decrease, in accordance with the well known operation of conventional discriminator circuits. This results in a voltage on potentiometers 74 and 75 capable of overcoming the bias battery 76 and making either tube 77 or 78 conductive. The motor 80 then rotates so as to vary the reactance 84 to retune the load circuit into resonance with the working frequency.

The coupling between the load circuit and the tank circuit is controlled in the same manner as in Figure 1 and therefore is believed not to require an elaborate description. When a variation in the resistive component of the load occurs the resistance reflected into the tank circuit 58, 59 changes and, in the same manner as described in Figure 1, this causes the coupling control circuit to readjust the coupling so as to return the Q in the tank circuit to its predetermined value.

Two specific embodiments of my invention have been described and illustrated. Many variations of these embodiments and modifications of their operation will be apparent to those skilled in this art.

I claim:

1. Apparatus for heating material comprising a high frequency generator including an oscillator and a power amplifier, said power amplifier having an electron tube provided with anode and cathode electrodes, an antiresonant tank circuit connected between the anode and cathode electrodes, a variable load circuit coupled to said antiresonant circuit, means for deriving a voltage proportional to the circulating current of said tank circuit and a voltage proportional to the anode to cathode current, means for comparing the phases of said voltages and varying the reactance of the load circuit in response to the relative phases of said voltages so as to reduce changes in the relative phases of said voltages, and means for controlling the coupling between the load circuit and the antiresonant circuit in response to the relative amplitudes of said voltages so as to reduce relative changes in the amplitudes of said voltages.

2. Apparatus for heating material comprising a high frequency generator including an oscillator and a power amplifier, said power amplifier having an electron tube provided with anode and cathode electrodes, an antiresonant tank circuit connected between the anode and cathode electrodes, a variable load circuit coupled to said antiresonant circuit, means for deriving a voltage proportional to the circulating current of said tank circuit and a voltage proportional to the anode to cathode current, means for comparing the phases of said voltages and controlling the tuning of the load circuit in response to the relative phases of said voltages so as to reduce changes in the relative phases of said voltages.

3. Apparatus for heating material comprising a high frequency generator including an oscillator and a power amplifier, said power amplifier having an electron tube provided with anode and cathode electrodes, an antiresonant tank circuit connected between said anode and cathode electrodes, a variable load circuit coupled to said antiresonant circuit, means for deriving a high frequency voltage proportional to the circulating current of said tank circuit and a high frequency voltage proportional to the anode to cathode current, means for comparing the phases of said voltages and for controlling the tuning of said load circuit in response to the relative phases of said voltages so as to reduce the changes in the relative phases of said voltages and means for controlling the coupling between the load circuit and the tank circuit in response to the relative amplitudes of said voltages so as to reduce changes in the relative amplitudes of said voltages.

4. The combination set forth in claim 3 including means for reducing the coupling between said tank and load circuits during tuning of said load circuit.

5. In combination, a high frequency generator including an oscillator and a power amplifier, said power amplifier having an electron tube provided with anode and cathode electrodes, an anti-resonant load circuit coupled between said anode and cathode electrodes, a load circuit having inherently variable resistance and reactance, a variable coupling circuit for coupling said anti-resonant circuit to said variable load circuit, said load circuit including an adjustable tuning reactance, means responsive variations in the inherently variable reactance of said load circuit for controlling said adjustable reactance so as to compensate for variations in total reactance of said load circuit, and means for controlling the coupling of said variable coupling circuit between said load circuit and said anti-resonant tank circuit in response to variations of the Q value of said tank circuit so as to reduce variations in said Q value of said tank circuit, Q representing the ratio of reactance to resistance of said tank circuit.

6. In combination, a source of high frequency oscillation comprising an electron tube provided with anode and cathode electrodes, an anti-resonant tank circuit connected between said anode and cathode electrodes, said tank circuit having a predetermined Q value, a load circuit having inherently variable resistance and reactance, a variable coupling circuit for coupling said anti-resonant tank circuit to said variable load circuit, means for establishing frequency correspondence between the frequency of the output of said generator and the tuning of said load circuit, means responsive to variations in the inherently variable reactance of said load circuit for controlling said means for establishing frequency correspondance so as to reestablish correspondence between the frequency of the output of said generator and the tuning of said load circuit, and means for controlling the coupling of said variable coupling circuit between said load circuit and said anti-resonant circuit in response to variations of the Q value of said tank circuit due to variations of resistance and reactance of said load circuit so as to reduce deviations of said Q value of said tank circuit from said predetermined normal value, Q being the ratio of reactance to resistance of said tank circuit.

7. In combination, a source of high frequency oscillations operating at a predetermined normal frequency and comprising a tunable tank circuit, a tunable load circuit, means providing a predetermined normal coupling between said tank circuit and said tunable load circuit, means responsive to deviation between the tuning of said load circuit and the frequency of said source of high frequency oscillations for returning said load circuit to the frequency of said high frequency oscillations, means for reducing said normal coupling between said load circuit and said tank circuit during said returning of said load circuit, and means for re-establishing said predetermined normal coupling after operation of said means for reducing said normal coupling and after retuning of said load circuit.

8. In combination, a source of high frequency oscillations of a predetermined normal frequency, a tunable load circuit normally tuned to said normal frequency, means for establishing a predetermined normal coupling between said load circuit and said source of high frequency oscillations, means responsive to a predetermined deviation in any sense between the relative frequency of said high frequency oscillations and the tuning of said tunable load circuit for reducing said predetermined normal coupling between said load circuit and said source of high frequency oscillations, means for reducing said predetermined deviation to a further predetermined deviation, and means operable upon attainment of said further predetermined deviation for increasing said coupling to a further predetermined coupling.

9. In combination, a vacuum tube generator having an anti-resonant tank circuit, a load circuit having at least one variable reactive circuit parameter and at least one variable resistive circuit parameter, means for variably coupling said load circuit with said anti-resonant tank circuit, means responsive to variation of said at least one reactive circuit parameter for initially introducing a compensating variation of a circuit parameter of said anti-resonant tank circuit and for reducing said coupling, and means responsive to variations of said at least one resistive circuit parameter for only thereafter establishing a compensatory variation of said coupling.

10. In combination, a source of high frequency oscillations of predetermined normal frequency and predetermined normal loading, a load circuit for said source of high frequency oscillations, means for automatically re-establishing said normal frequency of said source of high frequency oscillations in response to deviations of the frequency of said source from said normal frequency, means for automatically re-establishing said normal loading of said source of high frequency oscillations in response to deviations of loading from said normal loading, and means for temporarily reducing said normal loading in response to a predetermined deviation from normal in any direction of the frequency of said source of high frequency oscillations and during operation of said means for automatically reestablishing said normal frequency.

11. In combination, a source of high frequency oscillations of predetermined normal frequency comprising an electronic tube, an anti-resonant oscillatory tank circuit coupled in driven relation with said electronic tube, a load circuit for said source of high frequency oscillations, means for establishing variable coupling between said load circuit and said tank circuit, said load circuit having variably resistive and reactive circuit components which reflect into said tank circuit resistive and reactive variations of impedance to effect variations of tuning and loading of said tank circuit, means responsive to a predetermined deviation of the frequency of said high frequency oscillations in any direction from said predetermined normal frequency for reducing said variable coupling, means for retuning said source of high frequency oscillations to said normal frequency, and means operative in response to substantial return of said source of high frequency oscillations to said normal frequency for increasing said variable coupling.

12. In combination, a source of high frequency oscillations of a predetermined normal frequency, a load circuit having predetermined normal coupling with said source of high frequency oscillations, means responsive to deviation in any sense of the frequency of said source of high frequency oscillations from said normal frequency for retuning said source of high frequency oscillations to said normal frequency, and means for reducing said normal coupling between said load circuit and said source of high frequency oscillations during said retuning.

13. In combination, a source of high frequency oscillations of a predetermined normal frequency, a load circuit having predetermined normal coupling with said source of high frequency oscillations, means responsive to deviation in any sense of the frequency of said source of high frequency oscillations from said normal frequency for retuning said source of high frequency oscillations to said normal frequency, means for reducing said normal coupling between said load circuit and said source of high frequency oscillations during said retuning, and means for re-establishing said normal coupling only after operation of said means for reducing said normal coupling.

14. In combination, a source of high frequency oscillations of a predetermined normal frequency, a tunable load circuit normally tuned to said normal frequency, means for establishing a predetermined normal coupling between said load circuit and said source of high frequency oscillations for providing a predetermined loading of said source of high frequency oscillations by said tunable load circuit, means responsive to a predetermined deviation in any sense between the relative frequency of said high frequency oscillations and the tuning of said tunable load circuit for reducing said predetermined normal coupling between said load circuit and said source of high frequency oscillations, whereby to substantially unload said source of high frequency oscillations, means operable while said source of high frequency oscillation is unloaded for reducing said predetermined deviation to a further predetermined deviation, and means operable upon attainment of said further predetermined deviation for increasing said coupling to re-establish said predetermined loading of said source of high frequency oscillations.

15. In combination, a tank circuit, means for maintaining oscillations in said tank circuit, a load circuit, means for variably coupling said tank circuit and said load circuit, means for measuring the resistance reflected into said tank circuit from said load circuit, means for measuring the reactance reflected into said tank circuit from said load circuit, means responsive to deviation of the tuning of said tank circuit from a predetermined value by reason of said reactance reflected into said tank circuit from said load circuit for compensating said deviation of tuning, means responsive to deviation of the resistance reflected into said tank circuit for varying said coupling to compensate said deviation of resistance, and means responsive to operation of said means for compensating said deviation of tuning for effecting operation of said means for varying said coupling for initially reducing said coupling until said deviation of tuning is compensated and for thereafter increasing said coupling until said deviation of resistance is compensated.

16. In combination, a tank circuit, means for maintaining oscillations in said tank circuit, a load circuit having variable circuit parameters, means for variably coupling said load circuit and said tank circuit, said load circuit reflecting variable resistance and reactance into said tank circuit, means responsive to a predetermined variation of effective tank circuit parameters due to said reflecting of resistance and reactance into said tank circuit for initially reducing the degree of coupling of said means for variably coupling, for thereafter compensating said variation of effective tank circuit parameters, and for thereafter increasing said coupling.

RAYMOND M. WILMOTTE.

REFERENCES CITED

The following references are of record in the file of this patent:

UNITED STATES PATENTS

| Number | Name | Date |
|---|---|---|
| 1,626,724 | Demarest et al. | May 3, 1927 |
| 2,015,178 | Frum | Sept. 24, 1935 |
| 2,151,127 | Logan et al. | Mar. 21, 1939 |
| 2,358,454 | Goldstine | Sept. 19, 1944 |
| 2,376,667 | Cunningham et al. | May 22, 1945 |
| 2,396,004 | Gilbert | Mar. 5, 1946 |
| 2,416,172 | Gregory et al. | Feb. 18, 1947 |
| 2,415,799 | Reifel | Feb. 11, 1947 |
| 2,463,533 | Harrison | Mar. 8, 1949 |
| 2,467,285 | Young et al. | Apr. 12, 1949 |
| 2,473,188 | Albin | June 14, 1949 |

OTHER REFERENCES

Automatic Tuning System for Preheating Plastics, by R. W. Gilbert, page 115; Electronics, Dec. 1944.